(12) United States Patent
Yen

(10) Patent No.: US 12,488,930 B2
(45) Date of Patent: Dec. 2, 2025

(54) INDUCTOR DEVICE

(71) Applicant: Realtek Semiconductor Corporation, Hsinchu (TW)

(72) Inventor: Hsiao-Tsung Yen, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 1087 days.

(21) Appl. No.: 17/450,558

(22) Filed: Oct. 12, 2021

(65) Prior Publication Data

US 2022/0399151 A1 Dec. 15, 2022

(30) Foreign Application Priority Data

Jun. 9, 2021 (TW) .................................. 110121012

(51) Int. Cl.
*H01F 27/29* (2006.01)
*H01F 27/28* (2006.01)
*H01F 17/00* (2006.01)

(52) U.S. Cl.
CPC ..... *H01F 27/2804* (2013.01); *H01F 27/2823* (2013.01); *H01F 27/29* (2013.01); *H01F 2017/004* (2013.01); *H01F 2017/0073* (2013.01)

(58) Field of Classification Search
CPC .. H01F 27/2804; H01F 27/2823; H01F 27/29; H01F 2017/004; H01F 2017/0073; H01F 17/0013

USPC ................................... 336/83, 200, 232, 192
See application file for complete search history.

(56) References Cited

U.S. PATENT DOCUMENTS 4,816,784 A * 3/1989 Rabjohn ............. H01F 27/2804
336/200
10,153,078 B2* 12/2018 Yen ......................... H01F 27/29

FOREIGN PATENT DOCUMENTS

| CN | 101441934 A | 5/2009 | |
|---|---|---|---|
| TW | 201806112 A | 2/2018 | |
| TW | I722930 B | 3/2021 | |
| WO | WO-2006075217 A1 * | 7/2006 | ......... H01F 17/0006 |

* cited by examiner

*Primary Examiner* — Tuyen T Nguyen
(74) *Attorney, Agent, or Firm* — CKC & Partners Co., LLC

(57) ABSTRACT

An inductor device includes a first trace, a second trace, an input/output terminal, a center-tapped terminal, and an interlaced connection portion. The first trace is located on a first layer. The second is located on the first layer. The input/output terminal is disposed at a first side of the inductor device. The center-tapped terminal is disposed at a second side of the inductor device. The interlaced connection portion is disposed at a third side or a fourth side of the inductor device, and coupled to the first trace or the second trace. No interlaced connection structure is disposed along a connection line between the input/output terminal and the center-tapped terminal.

18 Claims, 5 Drawing Sheets

INDUCTOR DEVICE

RELATED APPLICATIONS

This application claims priority to and the benefit of Taiwan Application Serial Number 110121012, filed on Jun. 9, 2021, the entire contents of which are incorporated herein by reference as if fully set forth below in its entirety and for all applicable purposes.

BACKGROUND

Field of Invention

The present disclosure relates to an electronic device. More particularly, the present disclosure relates to an inductor device.

Description of Related Art

The various types of inductors according to the prior art have their advantages and disadvantages. For example, inductance density of an inductor, having crossing structure, is low. In addition, the crossing structure is usually disposed at the center of the inductor, such that the design of the inductor is therefore limited. Therefore, the scopes of application of the above inductor are limited.

SUMMARY

The foregoing presents a simplified summary of the disclosure in order to provide a basic understanding to the reader. This summary is not an extensive overview of the disclosure and it does not identify key/critical elements of the present disclosure or delineate the scope of the present disclosure. Its sole purpose is to present some concepts disclosed herein in a simplified form as a prelude to the more detailed description that is presented later.

One aspect of the present disclosure is to provide an inductor device which includes a first trace, a second trace, an input/output terminal, a center-tapped terminal, and an interlaced connection portion. The first trace is located on a first layer. The second is located on the first layer. The input/output terminal is disposed at a first side of the inductor device. The center-tapped terminal is disposed at a second side of the inductor device. The interlaced connection portion is disposed at a third side or a fourth side of the inductor device, and coupled to the first trace or the second trace. No interlaced connection structure is disposed along a connection line between the input/output terminal and the center-tapped terminal.

Therefore, based on the technical content of the present disclosure, the interlaced connection portion of the inductor device of the present disclosure is disposed at two sides of the inductor device, and the interlaced connection portion does not have to dispose at the center of the inductor device. Therefore, the design of the inductor device of the present disclosure becomes simpler, such that the size of the inductor device can be reduced.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

According to the usual mode of operation, various features and elements in the figures have not been drawn to scale, which are drawn to the best way to present specific features and elements related to the disclosure. In addition, among the different figures, the same or similar element symbols refer to similar elements/components.

DESCRIPTION OF THE EMBODIMENTS

To make the contents of the present disclosure more thorough and complete, the following illustrative description is given with regard to the implementation aspects and embodiments of the present disclosure, which is not intended to limit the scope of the present disclosure. The features of the embodiments and the steps of the method and their sequences that constitute and implement the embodiments are described. However, other embodiments may be used to achieve the same or equivalent functions and step sequences.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include the singular. Specifically, as used herein and in the claims, the singular forms "a" and "an" include the plural reference unless the context clearly indicates otherwise.

Figure 1:
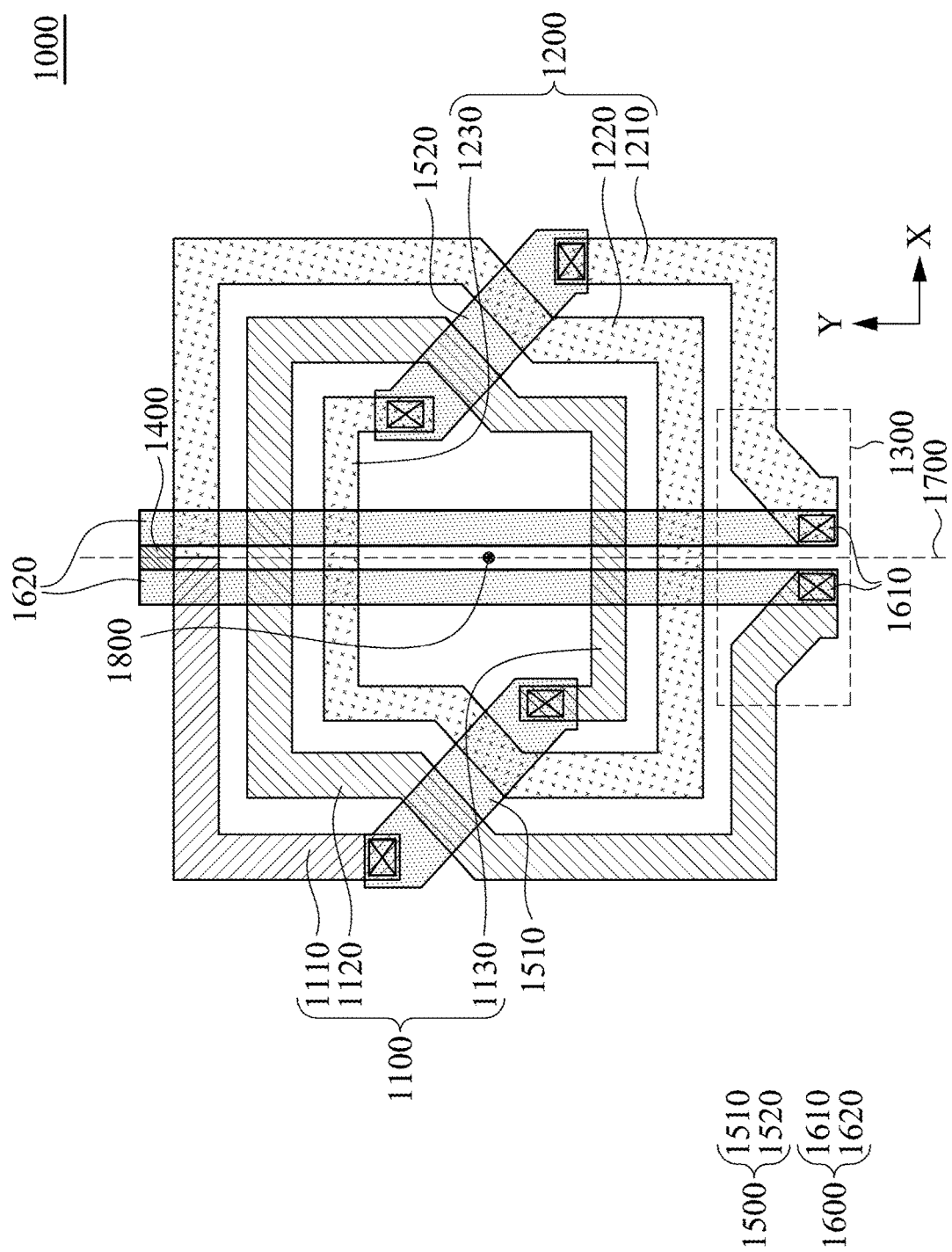
FIG. 1 depicts a schematic diagram of an inductor device according to one embodiment of the present disclosure.

FIG. 1 depicts a schematic diagram of an inductor device 1000 according to one embodiment of the present disclosure. As shown in the figure, the inductor device 1000 includes a first trace 1100, a second trace 1200, an input/output terminal 1300, a center-tapped terminal 1400, and an interlaced connection portion 1500.

With respect to structures, the first trace 1100 is located on a first layer, and the second trace 1200 is located on the first layer. The input/output terminal 1300 is disposed at a first side of the inductor device 1000, and the center-tapped terminal 1400 is disposed at a second side of the inductor device 1000. The interlaced connection portion 1500 is disposed at a third side or a fourth side of the inductor device 1000, and the interlaced connection portion 1500 is configured to couple to the first trace 1100 or the second trace 1200. For example, the input/output terminal 1300 is disposed at a lower side of the inductor device 1000, and the center-tapped terminal 1400 is disposed at an upper side of the inductor device 1000. The interlaced connection portion 1500 is disposed at a left side or a right side of the inductor device 1000.

In addition, no interlaced connection structure is disposed along a connection line between the input/output terminal 1300 and the center-tapped terminal 1400. For example, along a connection line 1700 between the input/output terminal 1300 and the center-tapped terminal 1400, there is no crossing structure. The interlaced connection portion 1500 of the present disclosure is disposed at the left side or the right side of the inductor device 1000, not disposed at the connection line 1700. Therefore, the design of the inductor device 1000 of the present disclosure becomes simpler, such that the size of the inductor device 1000 can be reduced.

In one embodiment, the inductor device 1000 further includes an extension portion 1600. The extension portion 1600 is located on a second layer. The extension portion 1600 is coupled to the input/output terminal 1300, and extents to a location which is above the center-tapped terminal 1400. As shown above, the input/output terminal 1300 of the present disclosure can extent to a side where the center-tapped terminal 1400 is located through the extension portion 1600. In addition, owing to the structure design of the inductor device 1000 of the present disclosure, the inductor device 1000 of the present disclosure can be implemented by only two layers.

As shown in FIG. 1, the extension portion 1600 includes a first terminal 1610 and a second terminal 1620. The first terminal 1610 of the extension portion 1600 is coupled to the input/output terminal 1300, and the second terminal 1620 of the extension portion 1600 is disposed above the center-tapped terminal 1400.

In one embodiment, the extension portion 1600 is not coupled to the center-tapped terminal 1400. In another embodiment, the extension portion 1600 crosses the first trace 1100 and the second trace 1200, and does not cross the interlaced connection portion 1500. In still another embodiment, in a direction which is perpendicular to the first trace 1100 and the second trace 1200, the extension portion 1600 does not overlap with the interlaced connection portion 1500. For example, the first trace 1100 and the second trace 1200 are located on a XY surface shown in the figure. In the Z axis which is perpendicular to the XY surface, the extension portion 1600 does not overlap with the interlaced connection portion 1500.

In one embodiment, the interlaced connection portion 1500 includes a first interlaced connection member 1510 and a second interlaced connection member 1520. The first interlaced connection member 1510 is disposed at a third side of the inductor device 1000, and the first interlaced connection member 1510 is configured to couple to the first trace 1100. In addition, the second interlaced connection member 1520 is disposed at a fourth side of the inductor device 1000, and the second interlaced connection member 1520 is configured to couple to the second trace 1200. For example, the first interlaced connection member 1510 is disposed at a left side of the inductor device 1000, and the first interlaced connection member 1510 is configured to couple to a sub-trace 1110 and a sub-trace 1130 of the first trace 1100. In addition, the second interlaced connection member 1520 is disposed at a right side of the inductor device 1000, and the second interlaced connection member 1520 is configured to couple to a sub-trace 1210 and a sub-trace 1230 of the second trace 1200.

In one embodiment, the first interlaced connection member 1510 crosses the first trace 1100 and the second trace 1200, and the second interlaced connection member 1520 crosses the first trace 1100 and the second trace 1200.

In another embodiment, the first trace 1100 forms the first wire 1100 (e.g. three sub-traces 1110, 1120, 1130), and the second trace 1200 form the second wire 1200 (e.g. three sub-traces 1210, 1220, 1230). The first wire 1100 and the second wire 1200 are symmetrical to each other. For example, the first wire 1100 and the second wire 1200 are in a point symmetry manner on a basis of a center point 1800.

In one embodiment, the input/output terminal 1300 and the center-tapped terminal 1400 is located on the first layer. In another embodiment, the interlaced connection portion 1500 is located on the second layer. In one embodiment, the first layer is different from the second layer.

In another embodiment, the first side of the inductor device 1000 is different from the second side, and the third side of the inductor device 1000 is different from the fourth side. In one embodiment, the first side and the second side of the inductor device 1000 are located on two opposite sides of the inductor device 1000, and the third side and the fourth side of the inductor device 1000 are located on two opposite sides of the inductor device 1000. For example, the first side of the inductor device 1000 is the upper side, the second side is the lower side, the third side is the left side, and the fourth side is the right side. It is noted that the present disclosure is not limited to the structure as shown in FIG. 1, and it is merely an example for illustrating one of the implements of the present disclosure.

Figure 2:
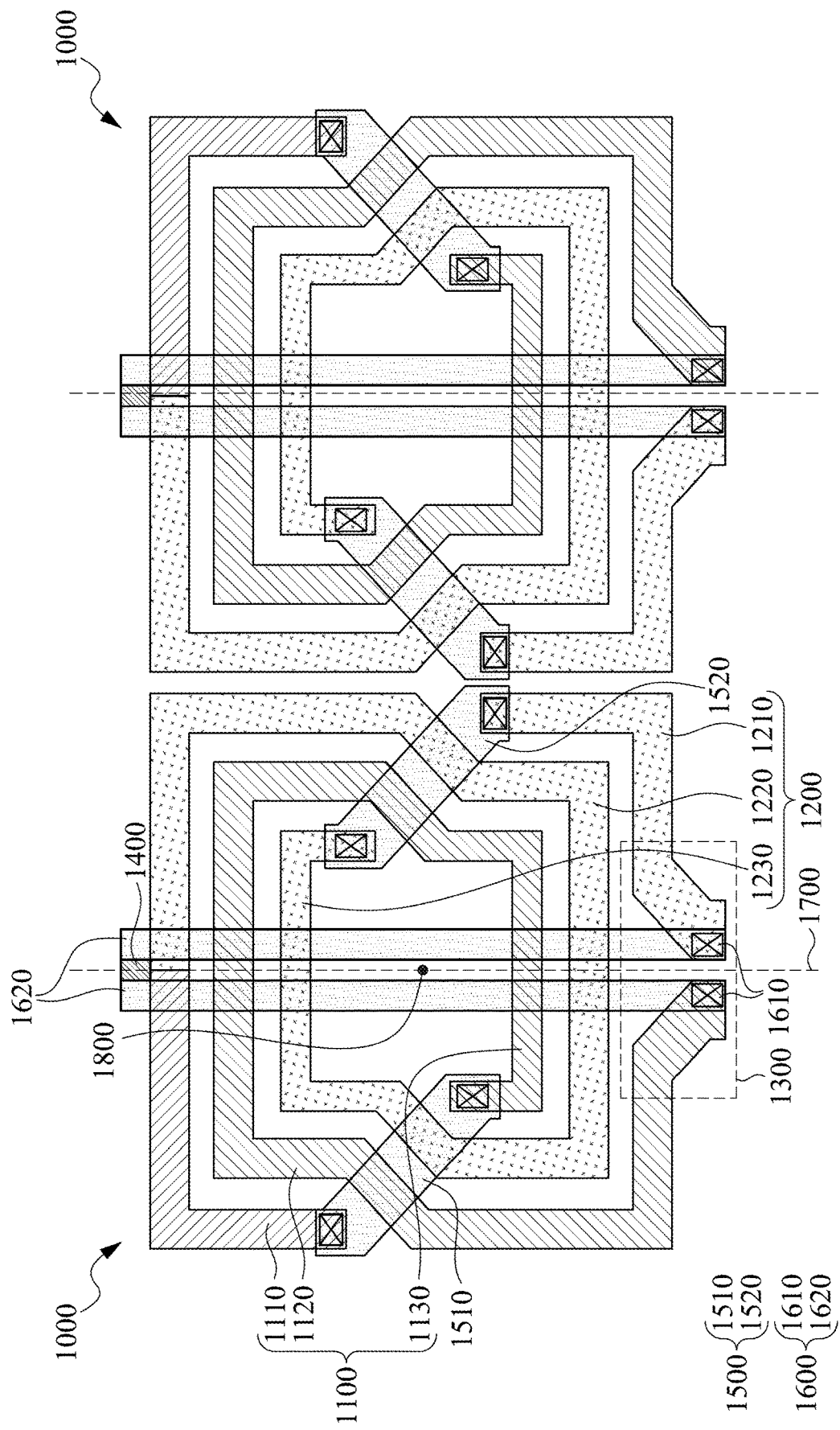
FIG. 2 depicts a schematic diagram of an integrated inductor according to one embodiment of the present disclosure.

FIG. 2 depicts a schematic diagram of an integrated inductor according to one embodiment of the present disclosure. As shown in the figure, two of the inductor devices 1000 shown in FIG. 1 of the present disclosure can be disposed in parallel, and the input/output terminal 1300 can extent to a side (e.g. the upper side in the figure) where the center-tapped terminal 1400 is located through the extension portion 1600. It is noted that the element in FIG. 2, whose symbol is similar to the symbol of the element in FIG. 1, has similar structure feature in connection with the element in FIG. 1. Therefore, a detail description regarding the structure feature of the element in FIG. 2 is omitted herein for the sake of brevity. In addition, the present disclosure is not limited to the structure as shown in FIG. 2, and it is merely an example for illustrating one of the implements of the present disclosure.

Figure 3:
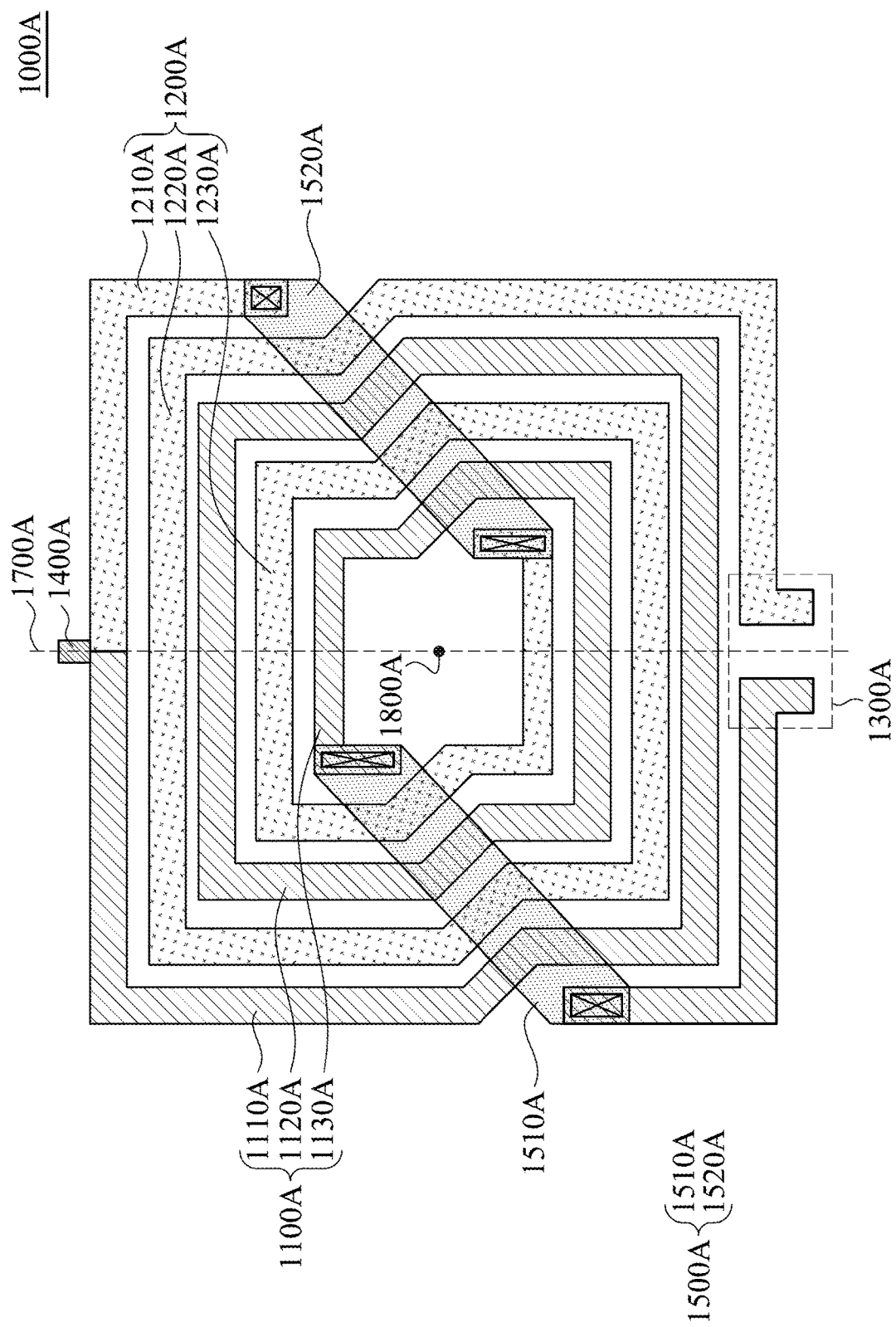
FIG. 3 depicts a schematic diagram of an inductor device according to one embodiment of the present disclosure.

FIG. 3 depicts a schematic diagram of an inductor device 1000A according to one embodiment of the present disclosure. Compared with the inductor device 1000 shown in FIG. 1, the disposition of the first trace 1100A, the second trace 1200A, and the interlaced connection portion 1500A of the inductor device 1000A shown in FIG. 3 is different.

As shown in the figure, the first trace 1100A forms at least two first wires, and the second trace 1200A forms at least two second wires. The first interlaced connection member 1510A of the interlaced connection portion 1500A crosses the at least two first wires and the at least two second wires. For example, the first trace 1100A forms first wires 1110A, 1120A, 1130A, and the second trace 1200A forms second wires 1210A, 1220A, 1230A. The first interlaced connection member 1510A crosses the first wires 1110A, 1120A, 1130A and the second wires 1210A, 1220A, 1230A. The input/output terminal 1300A of the present disclosure shown in FIG. 3 can extent to a side where the center-tapped terminal 1400A is located by extending a line from the input/output terminal 1300A through the center point 1800A.

In one embodiment, the second interlaced connection member 1520A of the interlaced connection portion 1500A crosses at least two first wires and at least two second wires. For example, the second interlaced connection member 1520A of the interlaced connection portion 1500A crosses first wires 1110A, 1120A, 1130A and second wires 1210A, 1220A, 1230A. It is noted that the element in FIG. 3, whose symbol is similar to the symbol of the element in FIG. 1, has similar structure feature in connection with the element in FIG. 1. Therefore, a detail description regarding the structure feature of the element in FIG. 3 is omitted herein for the sake of brevity. In addition, the present disclosure is not limited to the structure as shown in FIG. 3, and it is merely an example for illustrating one of the implements of the present disclosure.

Figure 4:
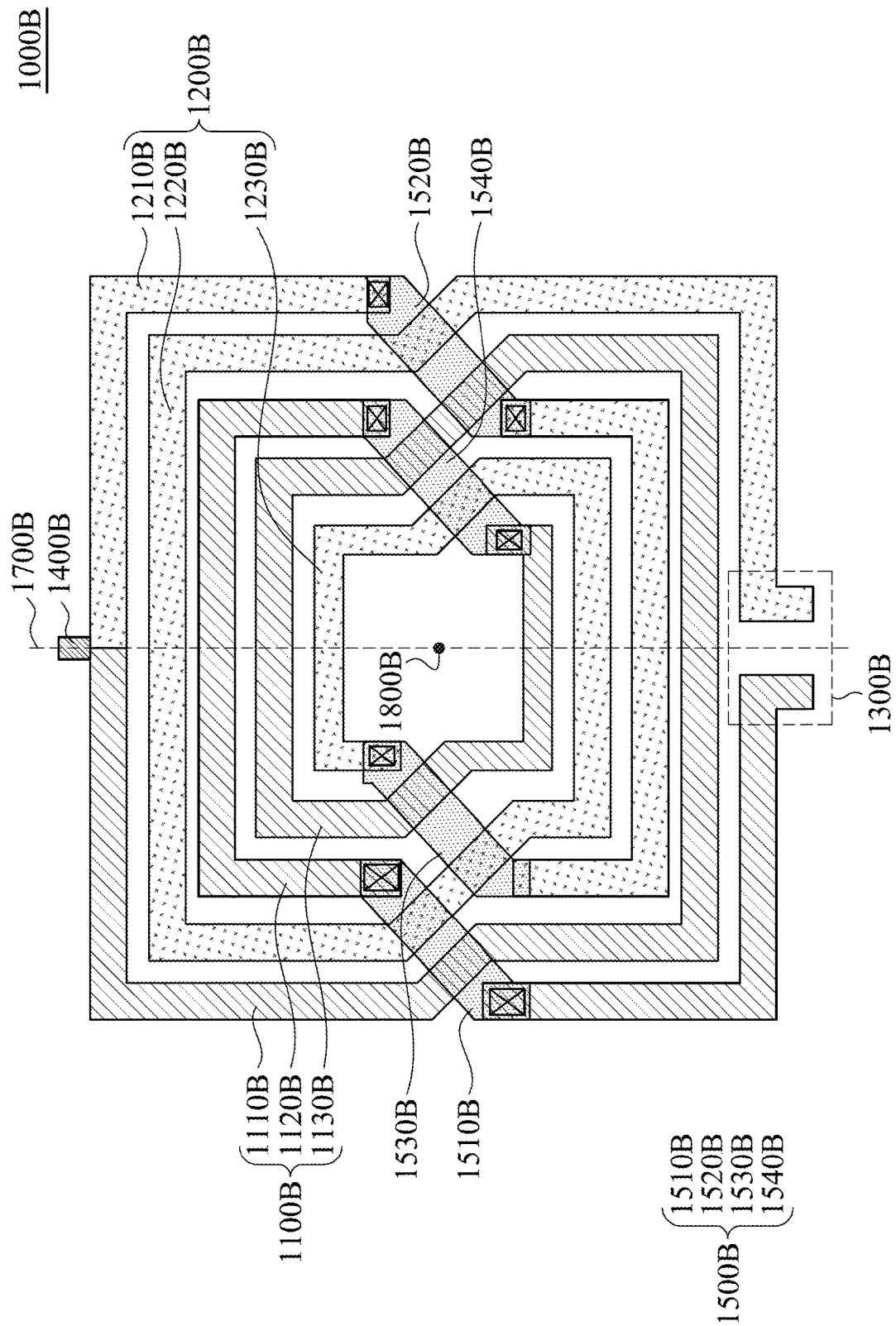
FIG. 4 depicts a schematic diagram of an inductor device according to one embodiment of the present disclosure.

FIG. 4 depicts a schematic diagram of an inductor device 1000B according to one embodiment of the present disclosure. Compared with the inductor device 1000 shown in FIG. 1, the disposition of the first trace 1100B, the second trace 1200B, and the interlaced connection portion 1500B of the inductor device 1000B shown in FIG. 4 is different.

As shown in the figure, the first interlaced connection member 1510B is disposed at the left side of the inductor device 1000B, and the first interlaced connection member 1510B is configured to couple to the sub-trace 1110B and the sub-trace 1120B of the first trace 1100B. The second interlaced connection member 1520B is disposed at the right side of the inductor device 1000B, and the second interlaced connection member 1520B is configured to couple to the sub-trace 1210B and the sub-trace 1220B of the second trace 1200B. The input/output terminal 1300B of the present disclosure shown in FIG. 4 can extent to a side where the center-tapped terminal 1400B is located by extending a line from the input/output terminal 1300B through the center point 1800B.

In one embodiment, the interlaced connection portion 1500B further includes a third interlaced connection member 1530B and a fourth interlaced connection member 1540B. The third interlaced connection member 1530B is disposed at the third side of the inductor device 1000B, and the third interlaced connection member 1530B is configured to couple to the second trace 1200B. In addition, the fourth interlaced connection member 1540B is disposed at the fourth side of the inductor device 1000B, and the fourth interlaced connection member 1540B is configured to couple to the first trace 1100B. For example, the third interlaced connection member 1530B is disposed at the left side of the inductor device 1000B, and the third interlaced connection member 1530B is configured to couple to the sub-trace 1220B and the sub-trace 1230B of the second trace 1200B. In addition, the fourth interlaced connection member 1540B is disposed at the right side of the inductor device 1000B, and the fourth interlaced connection member 1540B is configured to couple to the sub-trace 1120B and the sub-trace 1130B of the first trace 1100B.

In another embodiment, the first trace 1100B forms at least two first wires 1100B, and the second trace 1200B forms at least two second wires 1200B. The first interlaced connection member 1510B crosses the sub-wire 1110B of the first wire 1100B and the sub-wire 1210B of the second wire 1200B, and the second interlaced connection member 1520B crosses the sub-wire 1120B of the first wire 1100B and the sub-wire 1210B of the second wire 1200B.

In one embodiment, the third interlaced connection member 1530B crosses the sub-wire 1130B of the first wire 1100B and the sub-wire 1220B of the second wire 1200B, and the fourth interlaced connection member 1540B crosses the sub-wire 1120B of the first wire 1100B and the sub-wire 1230B of the second wire 1200B. It is noted that the element in FIG. 4, whose symbol is similar to the symbol of the element in FIG. 1, has similar structure feature in connection with the element in FIG. 1. Therefore, a detail description regarding the structure feature of the element in FIG. 4 is omitted herein for the sake of brevity. In addition, the present disclosure is not limited to the structure as shown in FIG. 4, and it is merely an example for illustrating one of the implements of the present disclosure.

Figure 5:
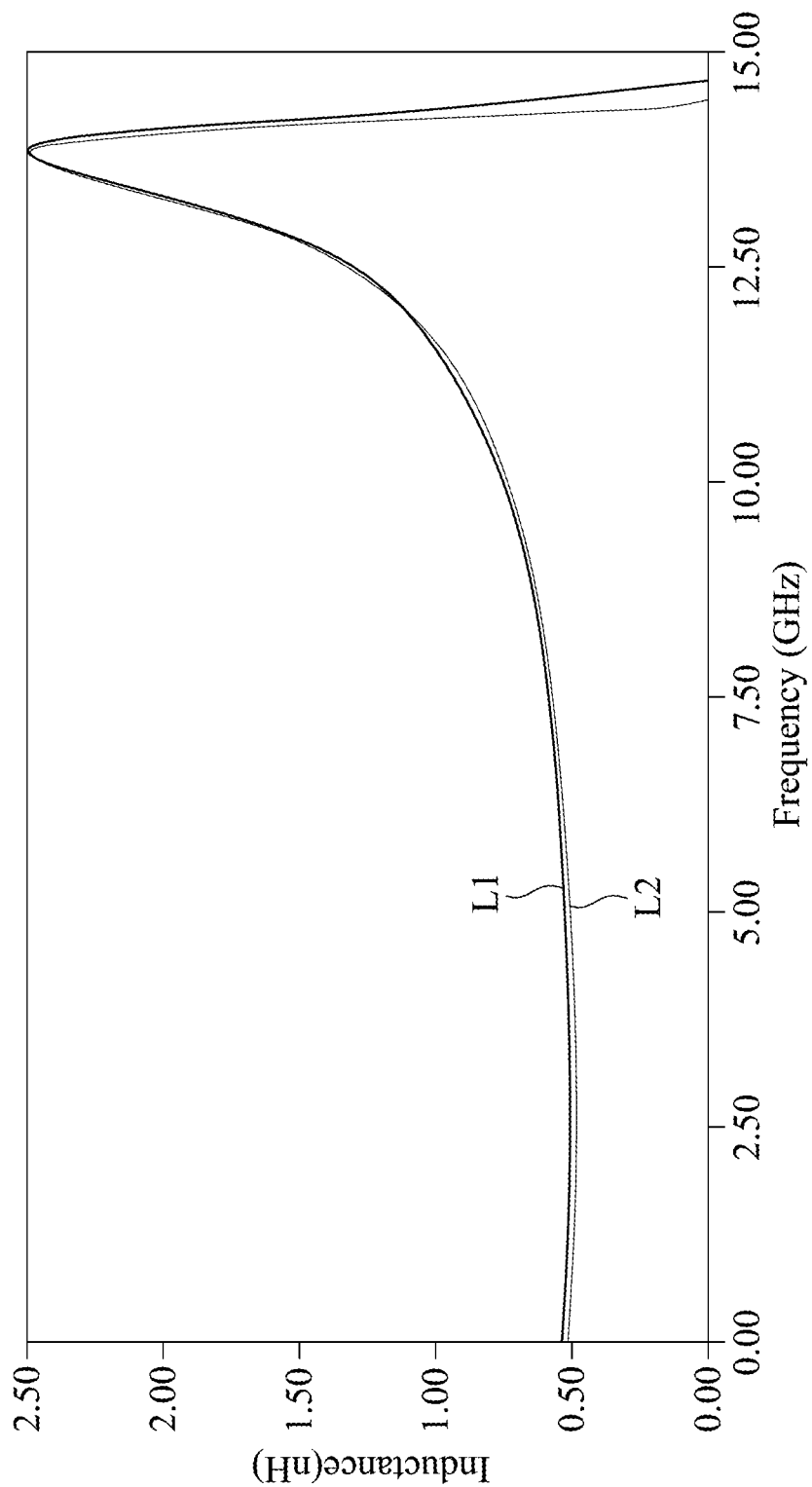
FIG. 5 depicts a schematic diagram of experimental data of an inductor device according to one embodiment of the present disclosure.

FIG. 5 depicts a schematic diagram of experimental data of inductor devices 1000, 1000A, and 1000B according to one embodiment of the present disclosure. As shown in the figure, the experimental curve of the inductance value of the first traces 1100, 1100A, 1100B of the inductor devices 1000, 1000A, 1000B adopting the structural configuration of the present disclosure at common mode is L1, and the experimental curve of the inductance value of the second traces 1200, 1200A, 1200B is L2. As shown in the figure, the experimental curves L1, L2 of the inductance value of two traces are extremely close to each other. As can be seen from the figure, the dispositions of the inductor devices 1000, 1000A, 1000B of the present disclosure are extremely symmetrical.

It can be understood from the embodiments of the present disclosure that application of the present disclosure has the following advantages. The interlaced connection portion of the inductor device of the present disclosure is disposed at two sides of the inductor device, and the interlaced connection portion does not have to dispose at the center of the inductor device. Therefore, the design of the inductor device of the present disclosure becomes simpler, such that the size of the inductor device can be reduced.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An inductor device, comprising:
    a first trace, located on a first layer;
    a second trace, located on the first layer;
    an input/output terminal, disposed at a first side of the inductor device;
    a center-tapped terminal, disposed at a second side of the inductor device; and
    an interlaced connection portion, disposed at a third side or a fourth side of the inductor device, and configured to couple to the first trace or the second trace;
    wherein an imaginary connecting line connecting the input/output terminal and the center-tapped terminal is defined and the imaginary connecting line is located at center of the inductor device, wherein there is no crossing structure that crosses and is disposed at the imaginary connecting line.

2. The inductor device of claim 1, further comprising:
    an extension portion, located on a second layer, wherein the extension portion extends along the imaginary connecting line, wherein a first terminal of the extension portion is coupled to the input/output terminal, and a second terminal of the extension portion is above the center-tapped terminal and is not coupled to the center-tapped terminal.

3. The inductor device of claim 2, wherein the extension portion crosses the first trace and the second trace, and does not cross the interlaced connection portion.

4. The inductor device of claim 3, wherein in a direction which is perpendicular to the first trace and the second trace, the extension portion does not overlap with the interlaced connection portion.

5. The inductor device of claim 1, wherein the interlaced connection portion comprises:
   a first interlaced connection member, disposed at the third side of the inductor device, and configured to couple to the first trace; and
   a second interlaced connection member, disposed at the fourth side of the inductor device, and configured to couple to the second trace.

6. The inductor device of claim 5, wherein the first interlaced connection member crosses the first trace and the second trace, and the second interlaced connection member crosses the first trace and the second trace.

7. The inductor device of claim 5, wherein the first trace forms at least two first wires, and the second trace forms at least two second wires, wherein the first interlaced connection member crosses the at least two first wires and the at least two second wires.

8. The inductor device of claim 7, wherein the second interlaced connection member crosses the at least two first wires and the at least two second wires.

9. The inductor device of claim 5, wherein the interlaced connection portion further comprises:
   a third interlaced connection member, disposed at the third side of the inductor device, and configured to couple to the second trace; and
   a fourth interlaced connection member, disposed at the fourth side of the inductor device, and configured to couple to the first trace.

10. The inductor device of claim 9, wherein the first trace forms at least two first wires, and the second trace forms at least two second wires, wherein the first interlaced connection member crosses one of the at least two first wires and one of the at least two second wires, and the second interlaced connection member crosses one of the at least two first wires and one of the at least two second wires.

11. The inductor device of claim 10, wherein the third interlaced connection member crosses one of the at least two first wires and one of the at least two second wires, and the fourth interlaced connection member crosses one of the at least two first wires and one of the at least two second wires.

12. The inductor device of claim 1, wherein the first trace forms a first wire, and the second trace forms a second wire, wherein the first wire and the second wire are symmetrical to each other.

13. The inductor device of claim 12, wherein the first wire and the second wire are in a point symmetry manner.

14. The inductor device of claim 2, wherein the input/output terminal and the center-tapped terminal are located on the first layer.

15. The inductor device of claim 14, wherein the interlaced connection portion is located on the second layer.

16. The inductor device of claim 15, wherein the first layer is different from the second layer.

17. The inductor device of claim 1, wherein the first side is different from the second side, and the third side is different from the fourth side.

18. The inductor device of claim 17, wherein the first side and the second side are located at two opposite sides of the inductor device, and the third side and the fourth side are located at two opposite sides of the inductor device.

* * * * *